(12) United States Patent
Shank et al.

(10) Patent No.: US 12,028,053 B2
(45) Date of Patent: Jul. 2, 2024

(54) STRUCTURE INCLUDING RESISTOR NETWORK FOR BACK BIASING FET STACK

(71) Applicant: GlobalFoundries U.S. Inc., Malta, NY (US)

(72) Inventors: Steven M. Shank, Jericho, VT (US); Yves T. Ngu, Essex Junction, VT (US); Michael J. Zierak, Colchester, VT (US); Siva P. Adusumilli, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 69 days.

(21) Appl. No.: 17/643,567

(22) Filed: Dec. 9, 2021

(65) Prior Publication Data

US 2023/0188131 A1  Jun. 15, 2023

(51) Int. Cl.
  *H03K 17/10* (2006.01)
  *H01L 21/8234* (2006.01)
  *H01L 27/06* (2006.01)
  *H01L 27/12* (2006.01)
  *H03K 17/693* (2006.01)

(52) U.S. Cl.
  CPC ... *H03K 17/102* (2013.01); *H01L 21/823462* (2013.01); *H01L 27/0629* (2013.01); *H01L 27/1203* (2013.01); *H03K 17/693* (2013.01); *H03K 2217/0018* (2013.01)

(58) Field of Classification Search
  CPC ............. H01L 21/823462; H01L 21/84; H01L 29/78606; H01L 27/1203; H01L 29/78648; H03K 17/693

USPC ................................. 257/350; 438/152, 155
See application file for complete search history.

(56) References Cited

U.S. PATENT DOCUMENTS

| | | |
|---|---|---|
| 6,909,146 B1 | 6/2005 | Linn et al. |
| 7,910,450 B2 | 3/2011 | Chinthakindi et al. |
| 9,608,112 B2 | 3/2017 | Smith et al. |
| 10,229,932 B2 | 3/2019 | Whitefield |
| 11,043,432 B2 | 6/2021 | Blin et al. |

(Continued)

OTHER PUBLICATIONS

European Search Report dated Mar. 5, 2023 for Application 22203178. 3; Reference No. EP142267-DM249fib; pp. 7.

(Continued)

*Primary Examiner* — Hung K Vu
(74) *Attorney, Agent, or Firm* — Francois Pagette; Hoffman Warnick LLC

(57) ABSTRACT

A structure includes a field effect transistor (FET) stack including a plurality of transistors over a buried insulator layer. A polysilicon isolation region is in a substrate below the FET stack and the buried insulator layer. A resistor network is in the polysilicon isolation region, the resistor network having a different resistivity than the polysilicon isolation region. The resistor network may include a resistive wire having a first width and a resistive pad within the resistive wire under each FET in the FET stack. Each resistive pad has a second width larger than the first width of the resistive wire. A length of the resistive wire is different aside each resistive pad to adjust a threshold voltage of an adjacent FET in the FET stack to a predetermined value to compensate for non-linear voltage distribution between an input and an output of the FET stack.

18 Claims, 5 Drawing Sheets

(56) References Cited

U.S. PATENT DOCUMENTS

2010/0156510 A1    6/2010  Botula et al.
2015/0137238 A1*   5/2015  Tsunemi et al. ........ H01L 29/78
                                                         257/347
2021/0336005 A1   10/2021  Shank et al.

OTHER PUBLICATIONS

U.S. Appl. No. 16/992,165, filed Aug. 13, 2020, entitled "Bulk Semiconductor Structure with a Multi-Level Polycrystalline Semiconductor Region and Method".
Joseph et al., "Power Handling Capability of an SOI RF Switch," 2013 IEEE Radio Frequency Integrated Circuits Symposium, pp. 385-388.

* cited by examiner

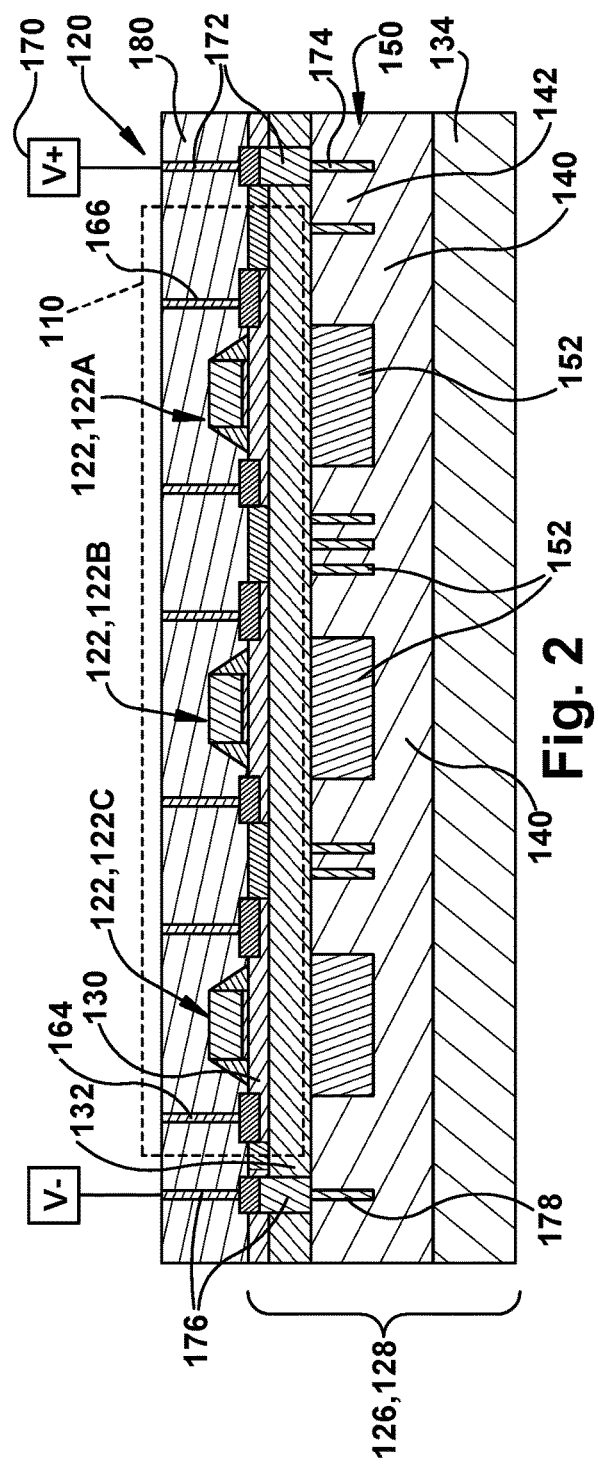
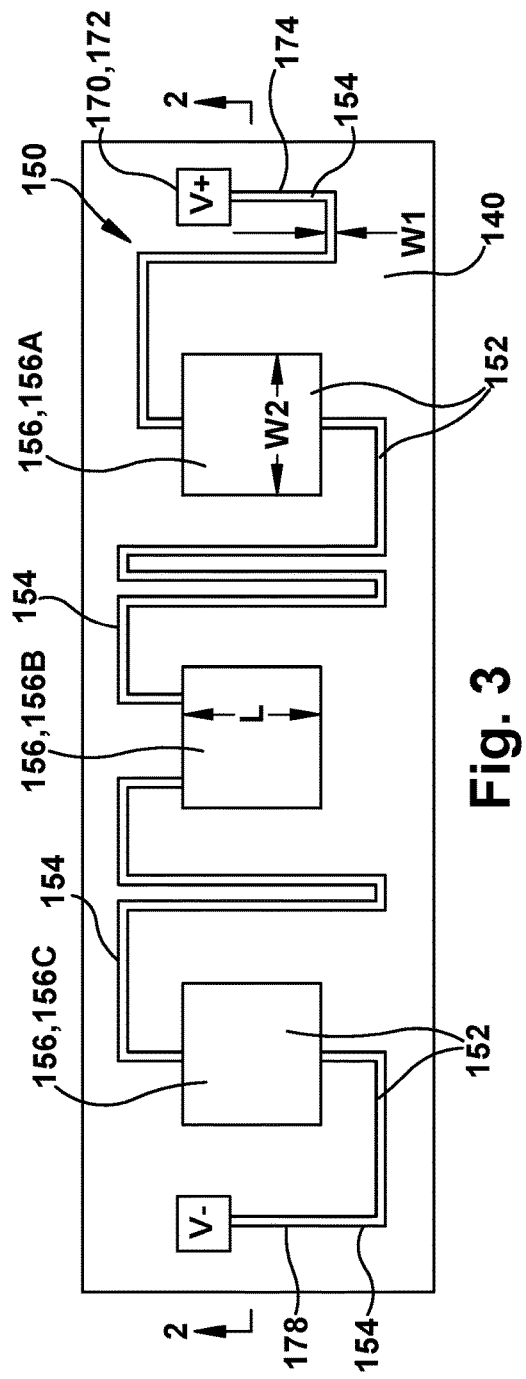
Fig. 2
Fig. 3

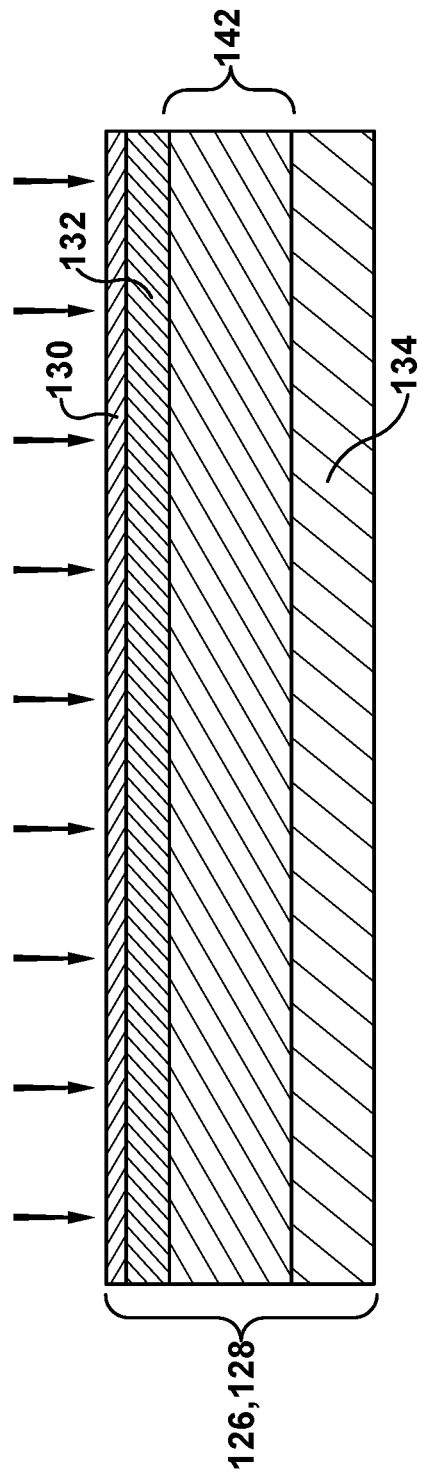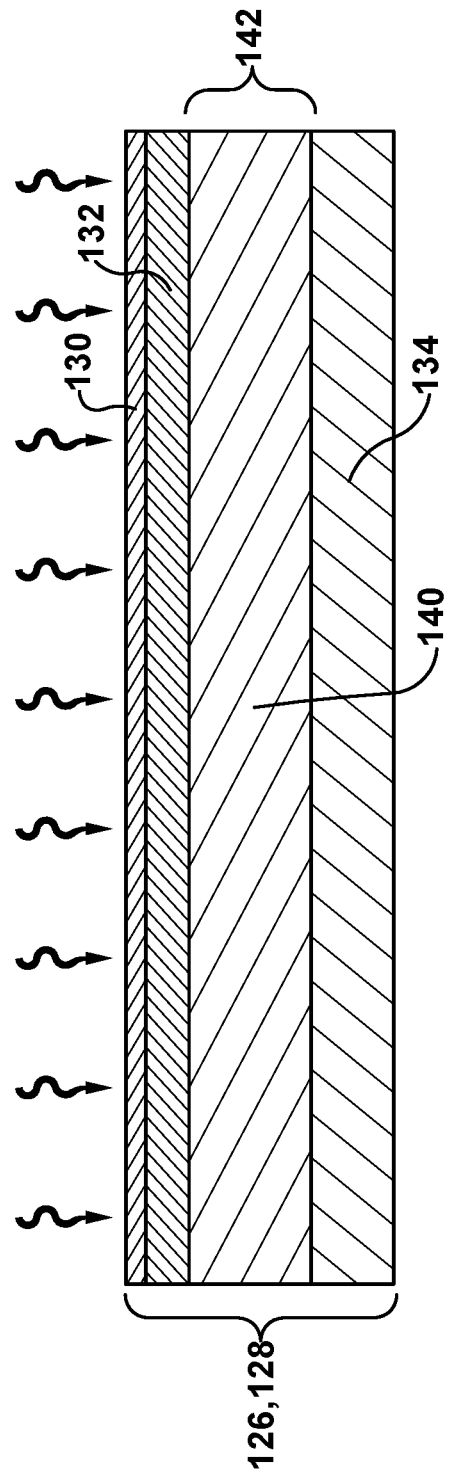

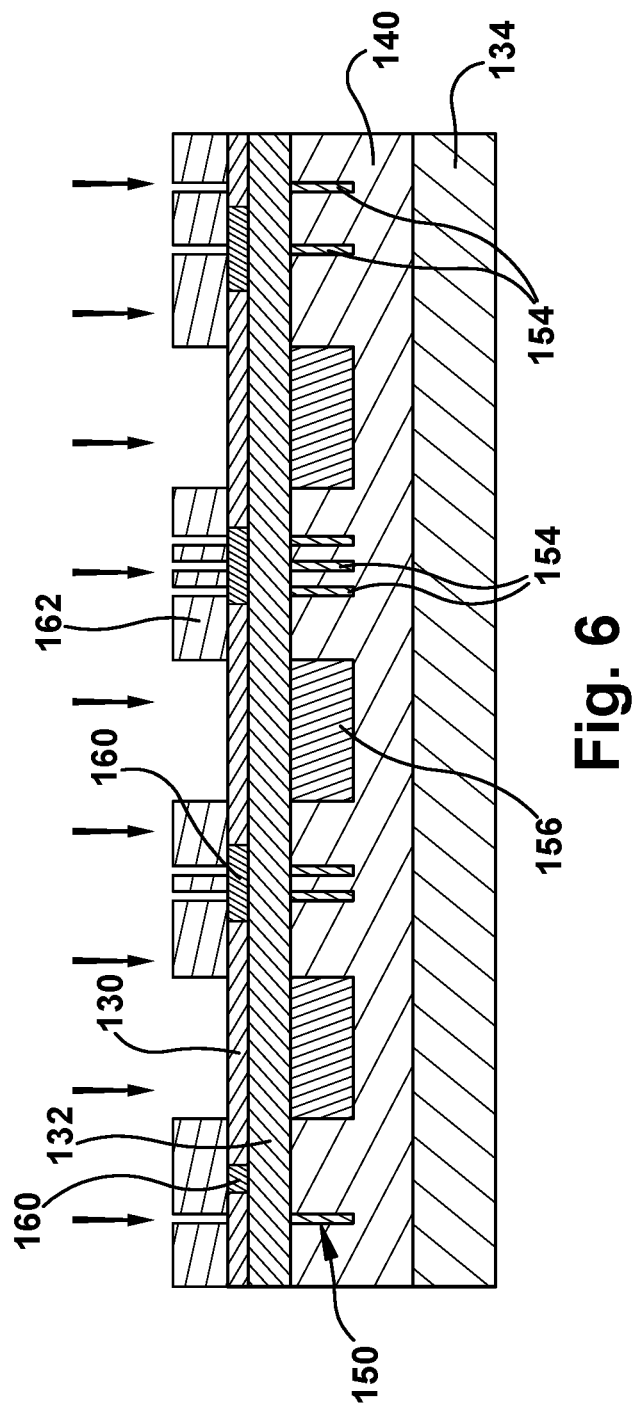

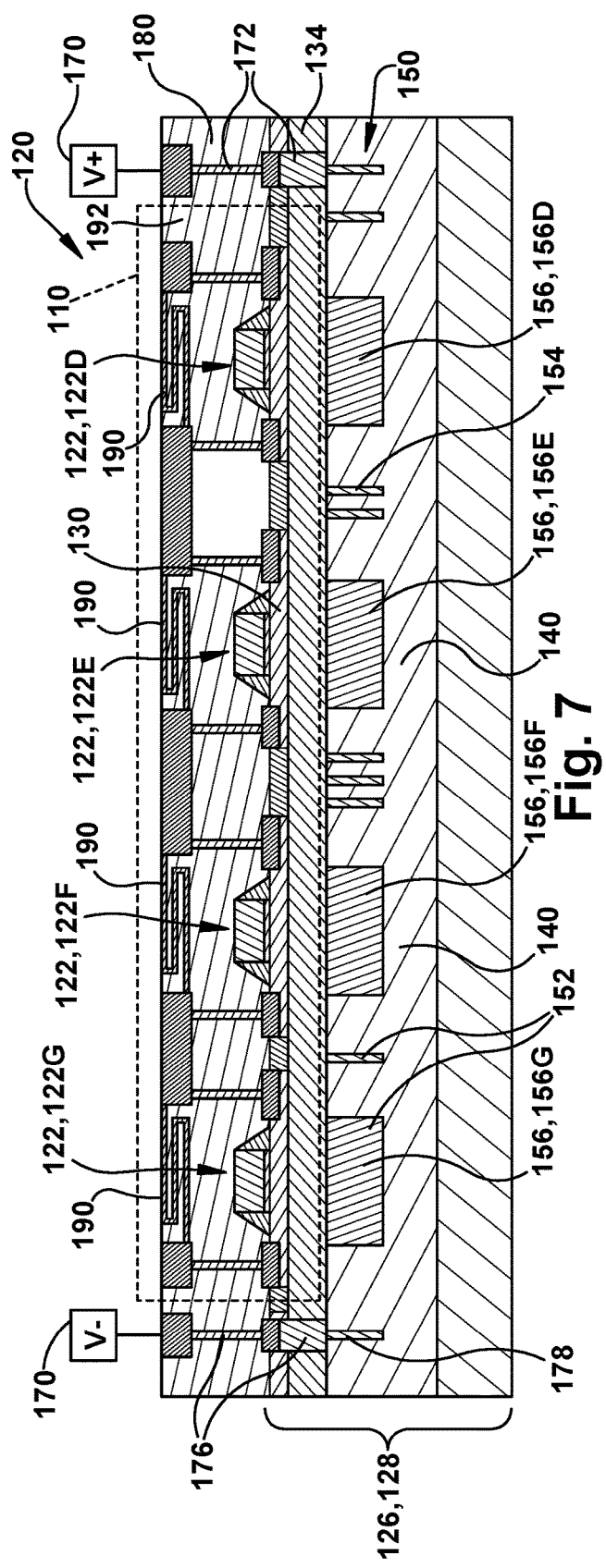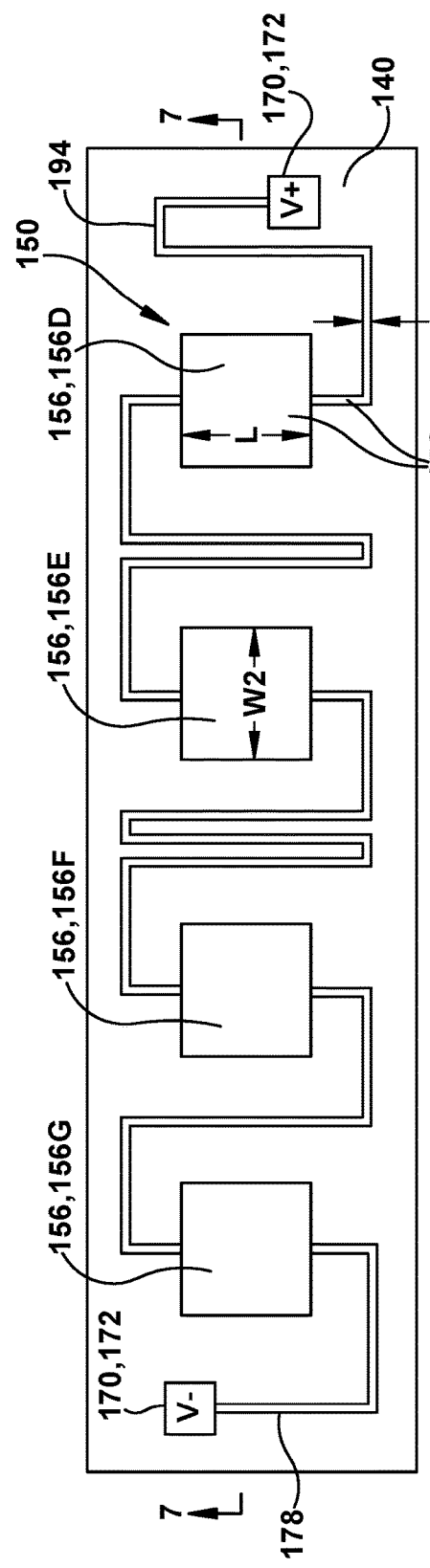

STRUCTURE INCLUDING RESISTOR NETWORK FOR BACK BIASING FET STACK

BACKGROUND

The present disclosure relates to field effect transistors (FETs), and more specifically, to a structure including a resistor network for back biasing a FET stack for such applications as a radio frequency (RF) switch structure.

In radio frequency (RF) circuitry and similar applications, a circuit design often includes substantial power amplification elements to perform various functions. In the example of RF technology, signal transmission may require signal amplification at a high voltage level, e.g., forty volts or more in some applications. In such devices, a single transistor may be ineffective for controlling the flow of current from one node to another. To accommodate high voltage and power requirements, stacks of FETs (i.e., several transistors coupled together at their source/drain terminals) are often deployed in a series combination. The multiple transistors may be structured to act as a single switch between two high voltage nodes of a circuit. During operation, FET stacks can exhibit an asymmetrical voltage distribution across their source and drain terminals. In some cases, the asymmetrical voltage may cause premature breakdown of FETs.

SUMMARY

An aspect of the disclosure related to a structure, comprising: a field effect transistor (FET) stack including a plurality of transistors over a buried insulator layer; a polysilicon isolation region in a substrate below the FET stack and the buried insulator layer; and a resistor network in the polysilicon isolation region, the resistor network having a different resistivity than the polysilicon isolation region.

Another aspect of the disclosure includes a switch structure, comprising: a plurality of field effect transistor (FET) stacks, each FET stack including a plurality of transistors over a buried insulator layer; a polysilicon isolation region in a substrate below at least one FET stack of the plurality of FET stacks and the buried insulator layer; a resistor network in the polysilicon isolation region under each FET of the at least one FET stack, the resistor network having a different resistivity than the polysilicon isolation region; and a voltage supply operatively coupled to the resistor network.

Another aspect of the disclosure is directed to a method, comprising: forming a resistor network under a field effect transistor (FET) stack including a plurality of FETs, the resistor network including a resistive wire having a first width and a resistive pad within the resistive wire under each FET in the FET stack, wherein each resistive pad has a second width larger than the first width of the resistive wire, and wherein a length of the resistive wire is different aside each resistive pad to adjust a threshold voltage of an adjacent FET in the FET stack to a predetermined value to compensate for non-linear voltage distribution between an input and an output of the FET stack.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 2 shows a cross-sectional view of a structure including a resistor network according to embodiments of the disclosure.

FIG. 3 shows a top down view of a structure including a resistor network in FIG. 2 according to embodiments of the disclosure.

FIG. 4 shows a cross-sectional view of starting to form a polysilicon isolation region according to embodiments of the disclosure.

FIG. 5 shows a cross-sectional view of forming a polysilicon isolation region according to embodiments of the disclosure.

FIG. 6 shows a cross-sectional view of forming a resistor network according to embodiments of the disclosure.

FIG. 7 shows a cross-sectional view of a structure including a resistor network according to other embodiments of the disclosure.

FIG. 8 shows a top down view of a structure including a resistor network of FIG. 7 according to other embodiments of the disclosure.

Figure 1:
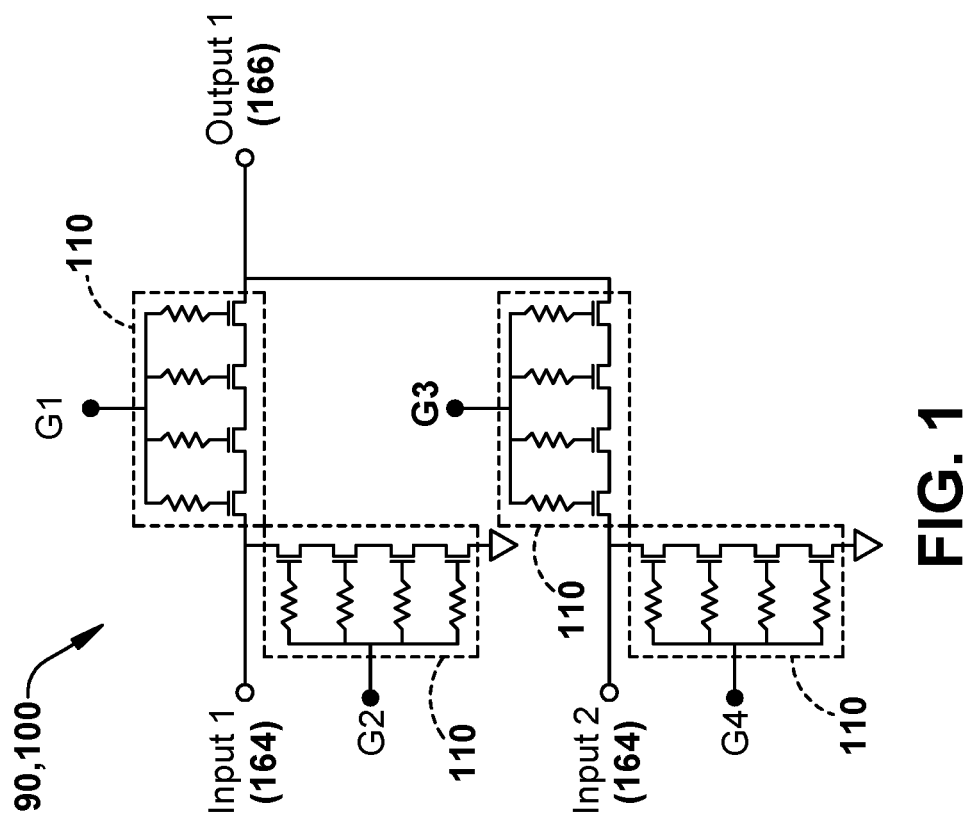
FIG. 1 shows a schematic view of a switch structure with a plurality of field effect transistor (FET) stacks according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Referring to FIG. 1, a schematic view of an integrated circuit (IC) structure 90 is shown. IC structure 90 includes an electrical switch structure within a portion of a switch structure 100 in, for example, an RF device and/or other electrical circuit for connecting one or more inputs to an output. In RF technology, signal transmission may require signal amplification at a high voltage level, e.g., forty volts or more in some applications. In such devices, a single transistor may be ineffective for controlling the flow of current from one node to another. To accommodate high voltage and power requirements, stacks of FETs 110 (i.e., several transistors coupled together at their source/drain terminals) are often deployed in a series combination. The multiple transistors may be structured to act as a single switch between two high voltage nodes of a circuit. In the example of FIG. 1, switch structure 100 selects between one of two inputs ("input 1" and "input 2," respectively) to be transmitted to an output node ("output"), e.g., for transmission, amplification, etc., as an RF signal. During operation, switch structure 100 may select input 1 or input 2 for transmission to the output by way of several FET stacks 110.

Switch structure 100 includes a plurality of FET stacks 110. Each FET stack 110 may be coupled to a shared gate (including, e.g., four gate nodes labeled G1, G2, G3, G4) for controlling whether current may pass through the source/drain terminals of a respective FET stack 110. When gate nodes G1, G4 are set to at least a threshold voltage while gate nodes G2, G3 are not set to at least the threshold voltage, current from input 1 may pass through FET stack 110 of node G1 to the output. In this state, current from input 2 is shunted to another node (i.e., deliberately shorted to another portion of the device) through FET stack 110 of node G4. When gate nodes G2, G3 are set to at least a threshold voltage while gate nodes G1, G4 are not set to at least the threshold voltage, current from input 2 may pass through FET stack 110 of node G3 to the output. In this case, current from input 1 is shunted to another node through FET stack 110 of node G2. FET stacks 110 controlled by gate nodes G1, G3 may be known as "series FET stacks" while FET stacks 110 controlled by gate nodes G2, G4 may be known as "shunt FET stacks," based on their operational purposes. While embodiments of the disclosure will be described relative to a particular FET stack(s) 110 in switch structure 100, it is understood that the disclosure may be implemented in any FET stack 110 (series and/or shunt versions) in switch structure 100, and the disclosure may also be applicable to other FET stacks 110 for other applications.

During operation, FET stacks 110 often exhibit an asymmetrical voltage distribution across their source and drain terminals caused, for example, by capacitive coupling to the substrate through a buried insulator layer. In some cases, the asymmetrical voltage may cause premature breakdown of FETs. Conventional approaches to mitigate this problem may rely on using a stack of FETs with higher breakdown voltage levels. However, such designs often exhibit higher resistance when turned on, and/or higher capacitance when turned off, and thus create other technical obstacles.

Embodiments of the disclosure provide structures and methods using a resistor network to control the threshold voltage across a FET stack 110 during operation, such that transistors located, for example, closer to the output have a different threshold voltage than transistors located closer to a respective input node. The resistor network allows each FET to have its threshold voltage customized to withstand the high input voltage, even if it is higher than an average across all of the FETs in the FET stack. According to an example, embodiments of the disclosure may apply a back bias to cause the threshold voltage of each transistor in a FET stack to, for example, increase as the conductive pathway moves from an input to an output. As the threshold voltage of a transistor increases, it more easily accommodates higher levels of source-drain voltage (Vds) and thus may accommodate higher amounts of power before breaking down. Embodiments of the disclosure thus vary the maximum power (Pmax) for each transistor within a single FET stack using a resistor network.

FIG. 2 shows a cross-sectional view of a structure 120, and FIG. 3 shows a schematic top down view of structure 120, according to embodiments of the disclosure. In FIG. 3, view line 2-2 indicate the cross-section of FIG. 2. Structure 120 includes a field effect transistor (FET) stack 110 including a plurality of transistors 122. FET stack 110 may have any application such as but not limited to switch structure 100, described relative to FIG. 1. For example, FET stack 110 may include at least one of a series FET stack (node G1 or G3) and a shunt FET stack (node G2, G4) within switch structure 100 (FIG. 1).

In FIG. 2, FET stack 110 is illustrated with three transistors 122 for purposes of description; however as understood in the art, any number of transistors 122 can be used in a FET stack 110. For example, in FIG. 1, each FET stack 110 includes four transistors. In the example shown, FET stack 110 is formed on a substrate 126 in the form of a semiconductor-on-insulator (SOI) substrate 128. SOI substrate 128 includes a layered semiconductor-insulator-semiconductor substrate in place of a more conventional silicon substrate (bulk substrate). SOI substrate 128 includes a semiconductor-on-insulator (SOI) layer 130 over a buried insulator layer 132 over a base semiconductor layer 134. SOI layer 130 and base semiconductor layer 134 may include any now known or later developed semiconductor such as but not limited to: silicon, germanium, silicon germanium, silicon carbide, etc. Buried insulator layer 132 may include any appropriate dielectric such as but not limited to silicon dioxide, i.e., forming a buried oxide (BOX) layer. Each transistor 122 may include any now known or later developed transistor structure for use in FET stack 110 and for using in SOI substrate 128. FET stack 110 and transistors 122 therein are over buried insulator layer 132. Hence, when FET stacks 110 are employed as a switch structure 100 (FIG. 1), the switch circuit includes a plurality of FET stacks 110. Each FET stack 110 includes transistors 122 over buried insulator layer 132.

Structure 120 also includes a polysilicon isolation region 140 in substrate 126 below FET stack 110 and buried insulator layer 132. Polysilicon isolation region 140 presents a high resistivity structure providing additional isolation of FET stack 110 from leakage through base semiconductor layer 134. Polysilicon isolation region 140 may be formed in an upper portion 142 (FIGS. 5-6) of base semiconductor layer 134 in any now known or later developed fashion. In one approach, shown in FIGS. 4-5, a dopant such as argon is introduced (straight arrows in FIG. 4) into base semiconductor layer 134 through SOI layer 130 and buried insulator layer 132, damaging upper portion 142 of base semiconductor layer 134. As shown in FIG. 5, a thermal cycle (curved arrows) is then applied to re-crystallize upper portion 142 into high resistivity, polysilicon isolation region 140. Polysilicon isolation region 140 may have any desired dopant concentration, and may have any desired depth in base semiconductor layer 134 as controlled by the doping process, e.g., an ion implanting power, duration, etc.

Returning to FIGS. 2-3, structure 120 also includes a resistor network 150 in polysilicon isolation region 140. Resistor network 150 has a different resistivity than polysilicon isolation region 140. Typically, resistor network 150 has a lower resistivity than polysilicon isolation region 140. Resistor network includes a doped polysilicon 152 that creates the different resistivity. Doped polysilicon 152 may include any desired dopants with any dopant concentration to create a desired resistivity. Doped polysilicon 152 may create the different resistivity by using a different dopant and/or a different dopant concentration than polysilicon isolation region 140. In one non-limiting example, the dopant may include boron, phosphorous, arsenic, etc. Resistor network 150 does not extend to the same depth in base semiconductor layer 134 as polysilicon isolation region 140, and thus polysilicon isolation region 140 surrounds sides and underside of resistor network 150. Buried insulator layer 132 is over resistor network 150.

FIG. 6 shows forming resistor network 150, which will eventually be under FET stack 110 including plurality of transistors 122, i.e., field effect transistors (FETs). Resistor network 150 may be formed by introducing dopants into polysilicon isolation region 140, e.g., by ion implanting. For example, FIG. 6 depicts trench isolation 160 formation in SOI layer 130, and patterning of a mask 162. Polysilicon isolation region 140 can be doped (straight arrows) to form resistor network 150. Once resistor network 150 is formed, mask 162 may be removed, e.g., using any appropriate ashing process.

As shown in FIGS. 2-3, resistor network 150 includes a resistive wire 154 having a first width (W1) and a resistive pad 156 within resistive wire 154 under each transistor 122 in FET stack 110. As shown in FIG. 3, each resistive pad 156 includes an enlarged area within resistive wire 154, and has a second width (W2) larger than first width (W1) of resistive wire 154. As noted, resistive wires 154 and resistive pads 156 include a dopant that provides a different resistivity compared to polysilicon isolation region 140.

As shown in FIG. 2, structure 120 may also include a voltage supply 170 operatively coupled to resistor network 150. Voltage supply 170 may control a back bias applied to FET stack 110. As will be described, the back bias compensates for non-linear voltage distribution between an input 164 and an output 166 of FET stack 110. Voltage supply 170 can be any now known or later developed voltage source for IC structure 90 (FIG. 1). Structure 120 may also include an input terminal 172 coupled to a first end 174 of resistive wire 154 and an output terminal 176 to a second end 178 of resistive wire 154. Terminals 172, 176 extends through buried insulator layer 132, among other structure. Terminals 172, 176 may include, for example, polysilicon extending through buried insulator layer 132. Terminals 172, 176 may also include any other now known or later developed interconnect structures such as vias and wires in interlayer dielectric layer(s) 180 (only one shown in FIG. 2). Terminals 172, 176 may be formed using any now known or later developed technique.

FIG. 2 shows structure 120 after formation of transistors 122 of FET stack 110. Transistor 122 formation can occur by any now known or later developed technique, including but not limited to: epitaxial growth and doping to form source/drains, gate formation, interlayer dielectric (ILD) 180 formation, and interconnect formation to various parts of each transistor 122, among other processes. Transistors 122 can be coupled together in any fashion to form FET stack 110, e.g., with their source/drains connected in series.

Resistor network 150 can be structured to customize a back bias applied to each transistor 122 to an appropriate level. The back gate bias increases or decreases a threshold voltage of each transistor 122 to address any asymmetric or non-linear voltage distribution between an input 164 and an output 166 of FET stack 110 (and across their source and drain terminals). More particularly, parts of resistor network 150 can adjust a threshold voltage of an adjacent transistor 122 in FET stack 110 to a predetermined value to compensate for non-linear voltage distribution.

Resistor network 150 can be customized to provide the desired back bias(es) to transistors 122 in FET stacks 110 by controlling a number of parameters. Resistor network 150 can be customized by the resistivity created by the dopant(s) and dopant concentration(s) used to form it, e.g., during doping as shown in FIG. 6. For example, the dopants and dopant concentrations can dictate a particular resistance per length of resistive wire 154, or per area of resistive pads 156. A size of parts of resistor network 150 also impacts the resistivity. For example, a width W1 of resistive wire 154 impacts the resistivity of resistor network 150 and the back bias generated thereby at different locations. For example, resistive wire 154 may have a predetermined width W1, which may be based on, for example, the particular technology node in which structure 120 is employed. In one non-limiting example, resistive wire 154 may have width W1 of approximately one micrometer (μm). Hence, resistive wire 154 may have a predetermined resistivity per length based on the dopants, dopant concentrations and resistive wire width.

Resistive wire 154 can have its length adjacent (and under) each transistor 122 sized to provide a desired back bias based on a particular input voltage from voltage supply 170 to resistor network 150. In this regard, a length of resistive wire 154 may be different aside each resistive pad 156 to adjust a threshold voltage of an adjacent transistor 122 in FET stack 110. The threshold voltage may be set to a predetermined value to compensate for non-linear voltage distribution between input 164 and output 166 of FET stack 110. The length of resistive wire 154 can be adjusted in any fashion. For example, as shown in FIG. 3, resistive wire 154 may be serpentine between at least two resistive pads 156. The number of turns and the length between turns of the serpentine can be customized, e.g., by controlling the pattern of mask 162 (FIG. 6). In the example in FIG. 3, resistive wire 154 has: one U-turn near input terminal 172, four U-turns between resistive pads 156A, 156B, three U-turns between resistive pads 156B, 156C, and one U-turn near output terminal 176. The turns need not be U-shaped in all cases, e.g., resistive wire 154 can include L-turns or other shapes of turns. The lengths between turns can be customized in any fashion.

Resistive pads 156 can also be sized with any desired second width (W2) and length (L) to provide a desired back bias to a particular transistor 122. That is, an area of each resistive pad 156 may be different under each transistor 122 to adjust a threshold voltage of an adjacent transistor 122 in FET stack 110. The threshold voltage may be set to a predetermined value to compensate for non-linear voltage distribution between input 164 and output 166 of FET stack 110. Resistive pads 156 also can be sized to provide the desired back bias in a uniform fashion to a particular transistor 122, compared to just having resistive wire 154 thereunder.

Resistor network 150 easily fits within a length of FET stack 110, which can be in one non-limiting example, 60-250 μm long.

During operation of FET stack 110, a voltage is supplied by voltage supply 170 to resistor network 150 to control a back bias applied to each transistor 122 in FET stack 110. As noted, the back bias compensates for non-linear voltage distribution between input and the output (FIG. 1) of FET stack 110. A voltage supplied by voltage supply 170 to resistor network 150 is thus controlled based on the structure of resistor network 150 and the desired back biases to be applied.

To illustrate operation of resistor network 150 in structure 120, one non-limiting example of operation relative to a FET stack 110 is described hereafter. First transistor 122A may have a threshold voltage of 0.4 volts (V) without being back biased, but may need to have a threshold voltage of 0.525V. This example indicates an underage of 0.125V. Based on the various structures in structure 120, it may be known that a back bias of 2.0V may be required to achieve the desired change in threshold voltage. With, for example, a 3V supply from voltage supply 170, a desired resistance can be achieved by controlling the length of resistive wire 154 and size of resistive pad 156 adjacent first transistor 122A. For example, based on 3V supply, a resistance of 90 kilo-Ohms may be required to create the back bias. Resistive wire 154 may be known to generate, for example, 3.3 kiloOhms per micrometer, resulting in a required length of approximately 27 micrometers for resistive wire 154 adjacent first transistor 122A (90/3.3). Similar calculations can be carried out for each transistor 122 in FET stack 110, e.g., transistor 122B, 122C, etc. Transistors 122B, 122C farther down FET stack 110 typically, but not necessarily, do not need as much adjustment, so length of resistive wire 154 can be shorter as one moves along FET stack 110, e.g., right to left in FIG. 2. It is noted that the voltage supply can be readily changed after fabrication to alter the relationship, especially between early resistive pads such as resistive pads 156A, 156B.

FIG. 7 shows a schematic cross-sectional view of structure 120, and FIG. 8 shows a schematic top down view of structure 120, according to other illustrative embodiments of the disclosure. In FIG. 8, see view line 7-7 indicating the cross-section of FIG. 7. Structure 120 is substantially similar to structure 120 in FIGS. 2-3, except it includes four transistors 122D-G, and resistor network 150 includes different sized resistive pads 156D-G and different length resistive wires 154 adjacent transistors 122D-G.

FIG. 7 also shows that structure 120 may optionally include a polysilicon resistor 190 in an interconnect layer 192 over at least one transistor 122 in FET stack 110. Polysilicon resistor(s) 190 are electrically coupled between a source and a drain of transistor(s) 122D-G. (Although shown directly over transistors 122, it will be recognized that polysilicon resistor(s) 190 are more than likely not directly over each transistor 122—they may be further into or out of the page of the schematic cross-sectional view of FIG. 7.) Resistor(s) 190 may also be employed to control a threshold voltage of transistors 122D-G in FET stack 110. It is noted, however, that polysilicon resistors 190 are limited in their ability to reduce threshold voltage because lowering the resistance in reduces the overall isolation of FET stack 110 to output voltages in an off-state, which can cause other operational challenges.

Embodiments of the disclosure provide a structure with a resistor network below a buried insulator layer. Resistor network 150 generates a back bias from a voltage supply 170 to compensate for non-linear voltage distribution between input and output of FET stack 110. Hence, resistor network 150 may eliminate the need to form transistors with higher threshold voltages. Resistor network 150 includes low resistivity material interleaved with a high resistivity, polysilicon isolation region 140, and hence, is bordered on the top by buried insulator layer 132 and the bottom by high resistivity polysilicon region 140. Resistive pads 156 provide a uniform application of the back bias. A resistor network 150 may be provided for each FET stack 110, or FET stacks 110 may share a resistor network 150.

The method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
    a field effect transistor (FET) stack including a plurality of transistors over a buried insulator layer;
    a polysilicon isolation region in a substrate below the FET stack and the buried insulator layer; and
    a resistor network in the polysilicon isolation region, the resistor network having a different resistivity than the polysilicon isolation region and including:
        a resistive wire having a first width, and
        a resistive pad within the resistive wire under each FET in the FET stack, each resistive pad having a second width larger than the first width of the resistive wire,
        wherein the resistive wire includes an upper surface substantially aligned with an upper surface of at least one resistive pad.

2. The structure of claim 1, further comprising a voltage supply operatively coupled to the resistor network.

3. The structure of claim 1, wherein a length of the resistive wire is different aside each resistive pad to adjust a threshold voltage of an adjacent FET in the FET stack to a predetermined value.

4. The structure of claim 1, wherein the resistive wire is serpentine between at least two resistive pads.

5. The structure of claim 1, further comprising an input terminal coupled to a first end of the resistive wire and an output terminal to a second end of the resistive wire, the input terminal and the output terminal extending through the buried insulator layer.

6. The structure of claim 1, wherein the resistor network has a lower resistivity than the polysilicon isolation region.

7. The structure of claim 1, further comprising a polysilicon resistor in an interconnect layer over at least one FET in the FET stack, the polysilicon resistor electrically coupled between a source and a drain of the at least one FET.

8. The structure of claim 1, wherein the FET stack comprises at least one of a series FET stack and a shunt FET stack within a radio frequency (RF) switch structure.

9. A switch structure, comprising:
    a plurality of field effect transistor (FET) stacks, each FET stack including a plurality of transistors over a buried insulator layer;
    a polysilicon isolation region in a substrate below at least one FET stack of the plurality of FET stacks and the buried insulator layer;
    a resistor network in the polysilicon isolation region under each FET of the at least one FET stack, the resistor network having a different resistivity than the polysilicon isolation region and including:
        a resistive wire having a first width, and
        a resistive pad within the resistive wire under each FET in the FET stack, each resistive pad having a second width larger than the first width of the resistive wire,
        wherein the resistive wire includes an upper surface substantially aligned with an upper surface of at least one resistive pad; and
    a voltage supply operatively coupled to the resistor network.

10. The switch structure of claim 9, wherein a length of the resistive wire is different aside each resistive pad to adjust a threshold voltage of an adjacent FET in the FET stack to a predetermined value to compensate for non-linear voltage distribution between an input and an output of the FET stack.

11. The switch structure of claim 9, wherein the resistive wire is serpentine between at least two resistive pads.

12. The switch structure of claim 9, wherein the resistor network has a lower resistivity than the polysilicon isolation region.

13. The switch structure of claim 9, wherein the at least one FET stack comprises at least one of a series FET stack and a shunt FET stack within a radio frequency (RF) switch structure.

14. A method, comprising:
    forming a field effect transistor (FET) stack including a plurality of transistors over a buried insulator layer;
    forming a polysilicon isolation region in a substrate below the FET stack and the buried insulator layer; and
    forming a resistor network in the polysilicon isolation region, the resistor network having a different resistivity than the polysilicon isolation region and including:
        a resistive wire having a first width, and
        a resistive pad within the resistive wire under each FET in the FET stack, wherein each resistive pad has a second width larger than the first width of the resistive wire,
    wherein the resistive wire includes an upper surface substantially aligned with an upper surface of at least one resistive pad; and
    wherein a length of the resistive wire is different aside each resistive pad to adjust a threshold voltage of an adjacent FET in the FET stack to a predetermined value to compensate for non-linear voltage distribution between an input and an output of the FET stack.

15. The method of claim 14, wherein the resistive wire is serpentine between at least two resistive pads.

16. The method of claim 14, wherein forming the resistor network includes doping the polysilicon isolation region in a substrate below the FET stack, wherein the polysilicon isolation region surrounds sides and an underside of the resistor network.

17. The method of claim 14, wherein the FET stack includes at least one of a series FET stack and a shunt FET stack within a radio frequency (RF) switch structure.

18. The method of claim 14, further comprising, during operation of the FET stack, supplying voltage to the resistor network to control a back bias applied to each FET in the FET stack, the back bias compensating for non-linear voltage distribution between the input and the output of the FET stack.

* * * * *